(12) United States Patent
Matsui et al.

(10) Patent No.: US 6,275,028 B1
(45) Date of Patent: Aug. 14, 2001

(54) METHODS FOR INITIALIZING AND/OR RESETTING GMR HEADS BY APPLYING OPPOSITELY DIRECTED MAGNETIC FIELDS

(75) Inventors: Takao Matsui, Yamato; Tatsuya Endo, Fujisawa; Hiroaki Suzuki, Machida; Kenji Kuroki; Katsushi Yamaguchi, both of Fujisawa; Hideo Asano, Machida, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/220,808

(22) Filed: Dec. 23, 1998

(30) Foreign Application Priority Data

Dec. 25, 1997 (JP) ................................................ 9-357912

(51) Int. Cl.[7] .............................. G11B 5/39; G11B 5/465; G01R 33/09; G01R 33/12
(52) U.S. Cl. ........................... 324/210; 324/228; 324/232; 324/252; 29/603.08; 360/324
(58) Field of Search ..................................... 324/202, 210, 324/212, 228, 232, 252; 360/66, 324; 29/595, 603.08, 603.09; 338/32 R; 365/158

(56) References Cited

U.S. PATENT DOCUMENTS 5,703,805 * 12/1997 Tehrani et al. .................... 365/158 X
5,969,523 * 10/1999 Chung et al. ........................ 324/252

* cited by examiner

Primary Examiner—Gerard R. Strecker
(74) Attorney, Agent, or Firm—Paik Saber; Ron Feece (57) ABSTRACT

In accordance with the present invention, the initialization for orienting the magnetized directions of the free layers of GMR heads (mounted on the diagonally shaded surface of sliders 14) by an external magnetic field is again executed also for the opposite direction, thereby to increase the yield of the GMR heads. Further, it is determined whether the magnetized direction of the pinned layer of GMR heads can be once reversed to the opposite direction, thereby to select damaged GMR heads at an early stage. Then, by performing a reset while performing a quasi-static test for seeing the read back response of the GMR head after restoring the magnetized direction of the pinned layer to a positive rotation, a safe and efficient reset is executed. The reset can be executed not only by applying only a pulse, but also while providing an external magnetic field in the pinning direction, or only by giving a high magnetic field. A tool 500 can be commonly used for the initialization, reset, or read back response through each process level. For the quasi-static test, coils 531, 532, and 533 are selectively used as Helmholz coils.

5 Claims, 9 Drawing Sheets

Wafer level

FIG. 1a

Row level

FIG. 1b

HGA level

FIG. 1c

HSA level

FIG. 1d

File level

METHODS FOR INITIALIZING AND/OR RESETTING GMR HEADS BY APPLYING OPPOSITELY DIRECTED MAGNETIC FIELDS

BACKGROUND OF THE INVENTION

1. Field of the Invention

The present invention is related to an apparatus and methods for maintaining or recovering the performance and the functions of a magnetic recording head utilizing a giant magnetoresistive (GMR) effect in the manufacturing process in which the head is used in a hard disk drive (HDD).

2. Description of Related Art

The magnetic recording head using the GMR effect (hereinafter referred to as GMR head) provides a sensitivity three times or more of that of the magnetic recording head using the ordinary magnetoresistance (MR) effect (AMR head hereinafter referred to as MR head). On the other hand, better sensitivity means more liability to damage by an external stimulus than the conventional MR head. For instance, GMR head is susceptible to the effect of a stimulus such as electrostatic discharge (hereinafter, referred to as ESD). The ESD means that, when two materials are put in contact with or separated from each other through abrasion, pressurization, or collision, static electricity is generated on both materials and remains on an insulating material or insulated conductor (charging), and the residual static electricity is instantly discharged when it is put in contact with a material. In addition, stimuli such as electrical overstress (hereinafter referred to as EOS) and thermal stress (or temperature stress) also have undesirable effects on the performance of GMR heads.

Accordingly, in the manufacturing process in which GMR heads are finally assembled into an HDD, maintaining the head performance by decreasing the possibility of undergoing such damages and recovering the function of GMR heads having experienced such damages become important.

Through the diagrammatical view of FIG. 1, each process level is defined. The "wafer level" (a) is a stage at which GMR elements (GMR heads) are formed into a multilayered structure at the stage of a wafer 10. The multilayered structure is described later in FIG. 2. The "row level" (b) is the stage at which GMR elements are taken out from the wafer into a strip 12 to form a row. In these levels (a) and (b), GMR heads may get exposed to an external stimulus through a step such as cutting, washing, lapping, or polishing. Although, in the FIG. 1(a) a diagrammatical expression is given so that one rectangle corresponds to one of the GMR elements, it is possible to actually extract many more GMR elements than those shown in this diagrammatical view. The "HGA level" (c) is a head gimbal assembly (HGA) level, and more particularly a stage at which a GMR element is attached to the end face of a slider 14, which is mounted on a suspension assembly 16 for supporting the slider 14. In fact, the size of the GMR element is much smaller as compared with the size of the slider (the end face of the slider). The "HSA level" (d) is a level at which a plurality of HGAs are collected into a stack 18, and for a rotary actuator, they form an assembly rotatable on a pivot in unison. The "file level" (e) is a stage at which they are assembled into an HDD 20 and data writing and reading are allowed.

A class of GMR elements is known as spin valve (SV) magnetoresistance sensors as explained below. The SV magnetoresistance sensor is a sensor in which the electrical resistance between two uncoupled ferromagnetic layers varies as cosine of the angle between the magnetized directions of the two layers, independently of the direction of current. Thus, the SV sensor is different from the anisotropic magnetoresistance (AMR) in which electrical resistance varies as $\cos^2$ (square of cosine) of the angle between the magnetized direction and the direction of current.

Figure 1A:
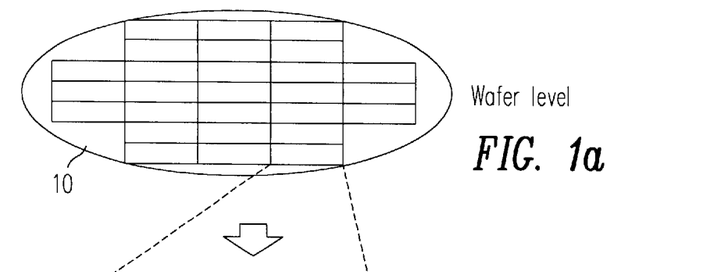
FIG. 1 is a diagrammatical view showing each process level of (a) to (e) of the GMR head.
Figure 1B:
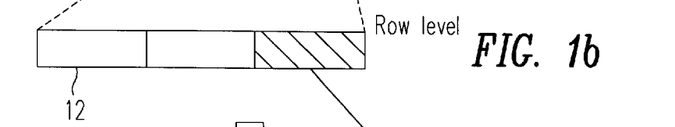
Figure 1C:
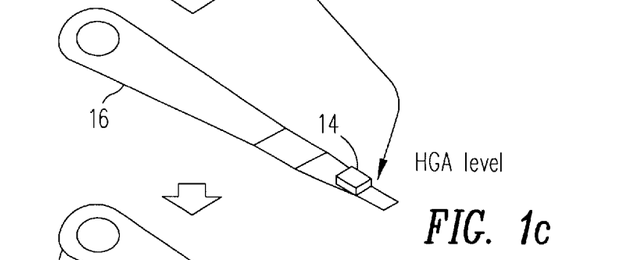
Figure 1D:
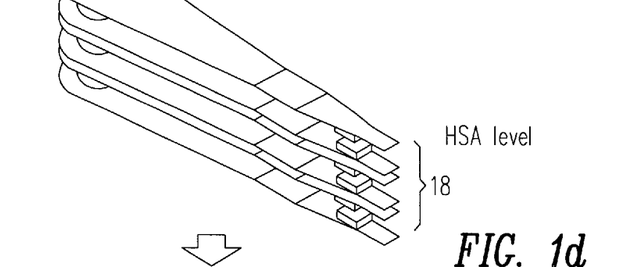
Figure 1E:
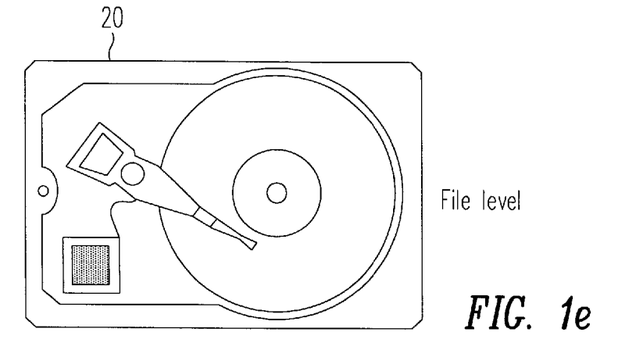
Figure 2:
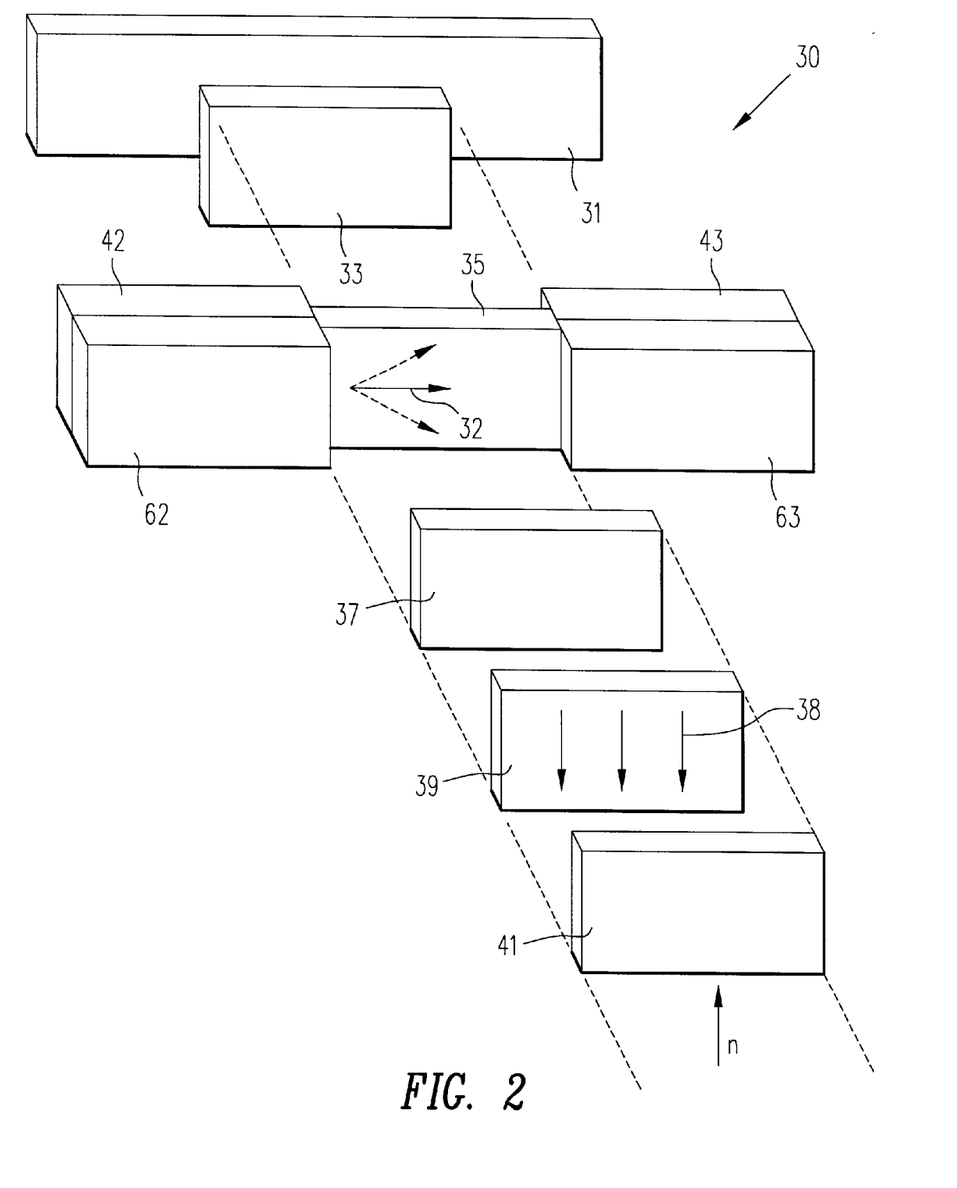
FIG. 2 is a perspective view showing the multilayered structure forming the spin valve sensor of the GMR head.

FIG. 2 is a perspective view showing the multilayered structure made up of the respective layers forming a spin valve (SV) sensor 30. An underlayer or a buffer layer 33 is disposed on a substrate 31 as needed, and subsequently, a first thin-film layer 35 formed of a soft ferromagnetic material provided as a free layer is disposed on the buffer layer 33. In the presence of an external magnetic field, the magnetization of the free layer 35 can freely rotate (the dotted arrows). If no external magnetic field exists, the magnetized direction matches the direction of the solid arrow 32. A thin-film nonmagnetic metallic spacer layer 37 is subsequently disposed on the free layer 35 followed by disposing a second thin-film layer 39 of ferromagnetic material (pinned layer) on the spacer layer 37 followed by disposing a thin-film layer 41 made of anti-ferromagnetic material having a relatively high electrical resistance on the pinned layer 39. There is an exchange coupling interaction between the pinned layer 39 and the anti-ferromagnetic layer 41.

Ferromagnetic end regions 42 and 43 are formed adjacent to the end portions of the free layer 35 on the substrate 31. In the present invention thin layers of permanent magnet are provided as substitutes for the ferromagnetic layers 42 and 43. Layers 62 and 63 formed over layers 42 and 43, respectively, are electrical leads used for allowing current to flow in the SV sensor 30. The current for resetting the GMR head, which is described later, flows through the GMR head from the layer 62 to the layer 63 or from layer 63 to layer 62. That is, in the direction of applying a current or a voltage pulse to the GMR element. The direction in which the current flows is decided in the design, but the current flows in the direction in which the magnetic field generated by the current helps the magnetization of the pinned layer. This direction is the longitudinal direction of the GMR element represented by a rectangle in FIG. 1(a), the direction vertical to the longitudinal direction of the suspension assembly 16 in FIG. 1(c), and the direction in which a current i flows in FIG. 5.

Furthermore, it should be noted that the stacking sequence of the layers 35, 37, 39, and 41 may be reversed to a stacking sequence of 41, 39, 37, and 35. The combination of the layers 35, 37, and 39 is necessary for achieving the function of the SV sensor, but there is a choice as to the stacking sequence to provide better characteristics. In the present invention, the stacking sequence which is opposite to the stacking sequence shown in FIG. 2 is employed. The so-called air bearing surface of a magnetic recording disk is in the direction vertical to the direction of a signal field h. It is because the GMR element is attached to the surface corresponding to the end portion of the slider, as seen from FIG. 1(c) and FIG. 10.

The operation of orienting the polarity of the magnetized direction of the free layer by hard biasing by the use of an external magnetic field is called "initialization." Directly affected by the initialization are the thin layers 42 and 43 of permanent magnets where the magnetization of the end regions 42 and 43 is preferably biased in the longitudinal direction. The magnetized direction of the free layer is maintained by the layers 42 and 43. Note that the magnetization direction can be reversed by reversing the polarity of the external magnetic field (reversing the direction).

The GMR head needs to be magnetically and thermally stable, and in this respect, the stability of the exchange coupling between the ferromagnetic pinned layer 39 and the antiferromagnetic (AFM) thin-film layer 41 becomes a problem. In the manufacturing process in which the assembling is sequentially proceeded in the respective levels (a) to (e) of FIG. 1 described above, the exchange coupling may be weakened or completely disconnected by the damage caused by an external stimulus, so that the originally required function of the GMR head cannot be maintained.

To recover the function of the GMR head, an operation called reset is effective. The "reset" is to adjust the magnetized direction of the pinned layer.

The reason why the magnetized direction of the pinned layer can be adjusted is that, if the GMR head is heated to a temperature equal to or higher than the "blocking temperature" of the AFM layer by some action, the exchange coupling between the pinned layer 39 and the AFM layer 41 is once lost, and then the head is cooled in the presence of a magnetic field thereby pinning the pinned layer. Even in a state at which the temperature is lower than the blocking temperature, anisotropy tends to gradually decrease as the temperature increases.

It was found that the magnetized direction of the pinned layer may be adjusted by applying a simple relatively strong magnetic field. It is considered that this is because the magnetized direction partially disturbed in the magnetic domain may be adjusted. This is described later as a "high magnetic field method."

The reason why a damage is caused by a stimulus such as ESD or EOS is that portions heated to the blocking temperature or higher locally or globally appear in the layer of an anti-ferromagnetic material. However, in the reset operation, such phenomenon is artfully used.

However, there is a point to be noted. A heavy damage may be irreparable, and conversely, this means that there is a risk that, even an originally reparable light damage may be made destructive by a careless reset. However, effective reset of the GMR head requires application of a sufficiently high reset voltage.

Figure 3:
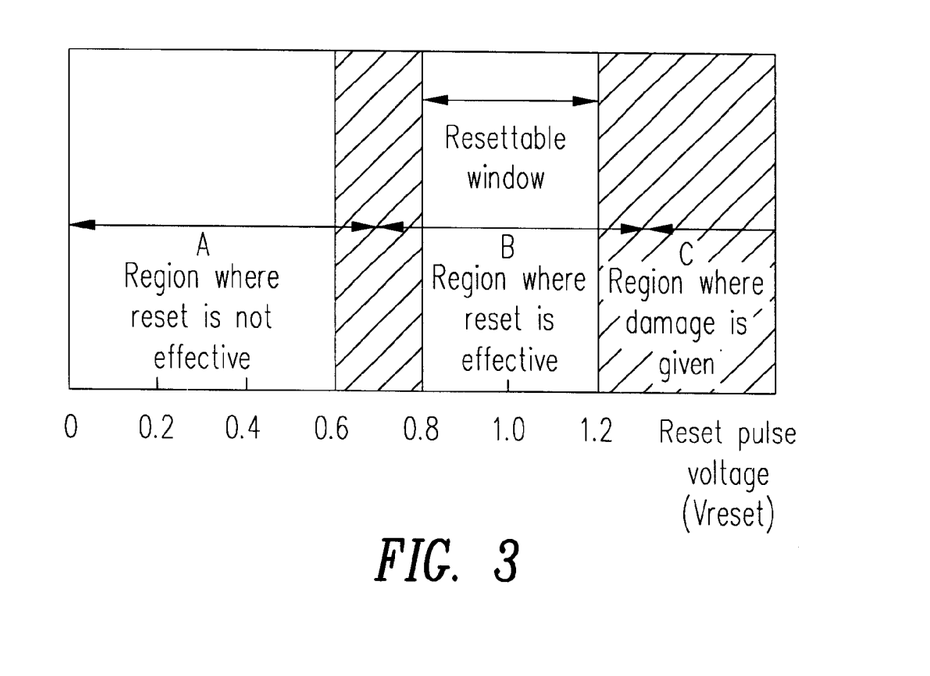
FIG. 3 is a diagram exemplifying the relationships between the reset pulse voltage and the regions related to the reset and the resettable window of the GMR head.

FIG. 3 separately exemplifies a region A where the reset by a reset voltage $V_{reset}$ is not effective, a region B where the reset is effective, and a region C where a damage is caused. The reset voltage value is only an example. First, the reset must be carefully executed in the region B in which the reset is effective. Furthermore, the diagonally shaded portions are gray zones in which the respective regions A, B, and C cannot be clearly discriminated. Such variable regions are caused to appear by indefinite factors such as a difference among individual products. The area provided by removing the gray zones from the resettable region B is called a "resettable window." Accordingly, the region of the resettable window has a direct relation with the yield and reliability of magnetic recording heads utilizing the GMR effect.

Figure 4:
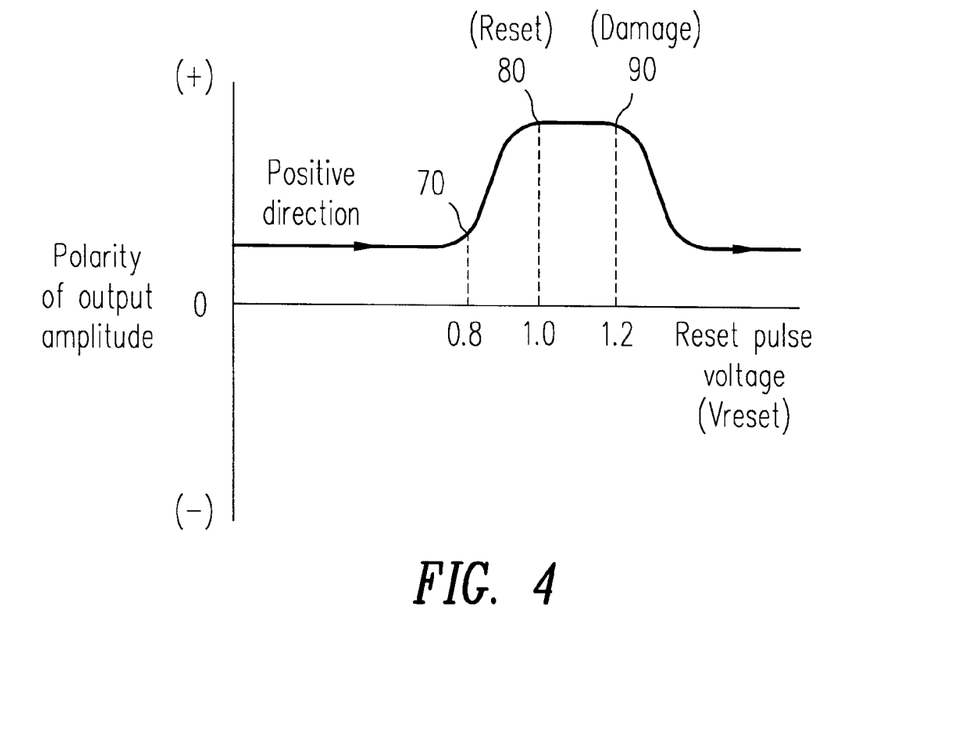
FIG. 4 is a graph exemplifying the general relationship between the reset pulse voltage and the output amplitude of the GMR head.

FIG. 4 shows the general relationship between the reset voltage $V_{reset}$ of a GMR head and its output amplitude. The output amplitude has a (+) polarity and a (−) polarity. The phase is reversed by 180 degrees between the (+) and (−) polarities. There is a region in which the output amplitude varies little while the reset voltage is low, but, for instance, like a position 70, the output amplitude begins to increase when a predetermined reset voltage is exceeded. To make the output amplitude of the GMR head as high as possible, it is preferable that the reset is performed until the higher output amplitude is gained, if it is possible. On the other hand, like a position 80, a region appears in which the output amplitude does not increase as much regardless of the increase in the reset voltage after a predetermined reset voltage is exceeded. If the reset voltage is further increased, a damage is caused at and after a position 90 and then the output amplitude begins to decrease. Accordingly, if a desired output amplitude can be obtained, the reset voltage is preferably held at around the position 80 which is in a low state, if it is possible. The reason is that, if the reset voltage is increased to a position between 80 and 90, and even if a damage can be avoided, a damage is caused if the same reset voltage is reapplied later. This means that, if the reset is made between 80 and 90, damage is less likely than if reset were stopped at 80. The number of times the reset voltage is applied is also a factor of the possibility of damage, and thus the number of times is preferably as small as possible.

According to the above characteristics of the GMR element, the degree of damage or the performance degradation can be evaluated through the reduction of the output amplitude. By measuring the output amplitude, the degree of the degradation of the head function can be evaluated, and the degree of recovery can also be evaluated after the head function is recovered. One such evaluation method is called a "quasi-static test," in which generally the output amplitude is measured as the read back response of the GMR head in a low-frequency magnetic field. This quasi-static test may be called a magnetostatic test. That is, the GMR head is placed in an AC magnetic field (a low-frequency magnetic field the direction and intensity of which vary with time), and its read back response is measured. A bias current (sense current) is supplied to the GMR head and the read back signal is measured. In the GMR head, the output amplitude does not depend on the frequency of the magnetic field. This is one of the merits unique to the GMR element.

There are mainly three reasons for the occurrence of the degradation. The first reason is that the temperature in at least part of the GMR element becomes higher than the blocking temperature to release the pinning, as described above. This is a reversible change. The second and third reasons are generally that the film itself forming the GMR element is deteriorated. More specifically, the second reason is that an atomic movement or atomic diffusion is occurring in the film interface. The third reason is that the melting of the material forming the film is occurring. Among them, since the degradation by the first reason is reversible, it can be recovered by the reset. However, since those by the second and third reasons are irreversible, they cannot be recovered by the reset.

The degree of degradation can be evaluated mainly by the reduction of the output amplitude. However, a catastrophic degradation results in a permanent, irrecoverable reduction of output amplitude. In this respect, the evaluation is a problem if the GMR element has been damaged to a level which cannot be recovered by the reset because of the second and third reasons. As seen from FIG. 4, the output amplitude also appears as a reduction when the reset pulse passes the portion 90. If the degradation has reached such degree, the resistance value of the GMR head has often changed as compared with the previous resistance value. Thus, it is very useful that a determination is made as to whether the resistance value has changed.

In FIG. 5, various techniques (a) to (d) related to the reset of the GMR head are shown. Among them, the second technique (b) and the third technique (c) form the present invention by themselves, but they are also described in this section for ease of comparison with the first technique (a) and the fourth technique (d).

Figure 5A:
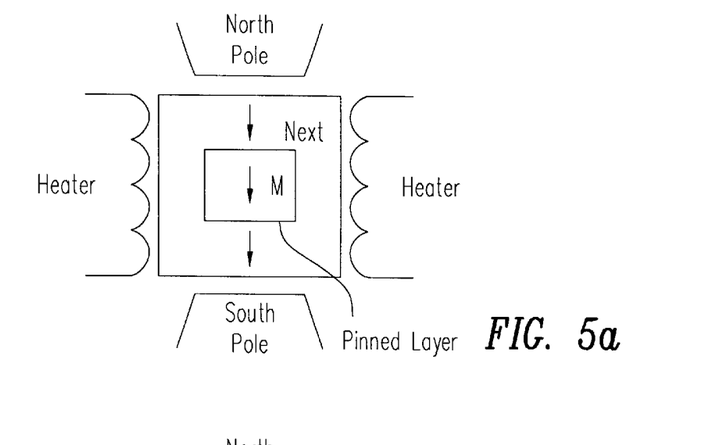
FIG. 5 is A diagrammatical view showing the techniques (a) to (d) related to the reset of the GMR head.

The first technique (a) is called a "thermo+magnetic field method." In this technique, an external magnetic field $H_{ext}$ is applied in a desired pinning direction in a temperature environment equal to or higher than the blocking temperature of exchange coupling followed by cooling down the GMR head. By this, the magnetization M is fixed. The heating can be performed, for instance, by a heater. The magnitude of the magnetic field is usually greater than 5000 Oe (oersted). This technique is ideal because the exchange coupling between the ferromagnetic layer and the antiferromagnetic layer can be uniformly obtained, but, if it is applied to a level of the manufacturing process after the wafer level, there is a side effect such as the deformation of other components (for instance, suspension) due to thermal expansion. Thus, it is not appropriate.

Figure 5B:
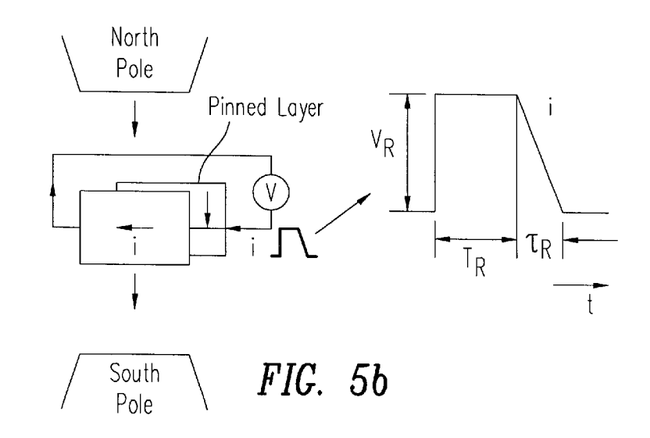

In the second technique (b) (the present invention), the GMR element is placed in a magnetic field, and a current or voltage pulse is applied to the element. The application of a pulse is intended to heat the GMR element to a temperature equal to or higher than the blocking temperature. Particularly in this case, a magnetic field equal to or greater than 5000 Oe is also applied in a desired pinning direction. The polarity of the pulse is preferably such that the magnetic field generated by the pulse is orienting in the direction of helping the pinning. But the reversed direction may be allowed if the external magnetic field is sufficiently high. This technique has a merit that the resettable window can be made relatively wide because of the help of the magnetic field, but it becomes complicated as a tool since a mechanism for generating a magnetic field must be provided in addition to the pulse. The above technique is called a "magnetic field+reset pulse method."

Figure 5C:
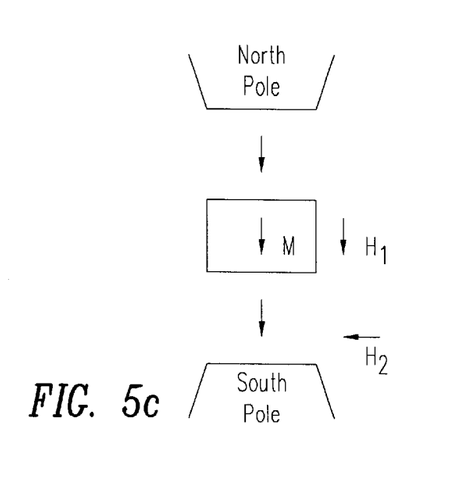

In the third technique (c) (present invention), a magnetic field $H_1$ is applied to the GMR element in the desired pinning direction, and a magnetic field $H_2$ is applied in the direction of initializing the hard bias. For instance, it is experimentally known that $H_1$ is preferably 10 to 15 kG (G: gauss) or larger, and $H_2$ is preferably about 5 kG. This technique has a merit that it has no risk of giving overstress and it has safety as long as they are magnetic fields of such intensity as can be commonly achieved. However, since consideration is made to safety, the effect is small without a high magnetic field, and there is little effect of adjusting the magnetized direction. This technique is called a "high magnetic field method." If safety is more emphasized, it is effective to perform the reset while gradually increasing the magnetic field which is an external stimulus.

Figure 5D:
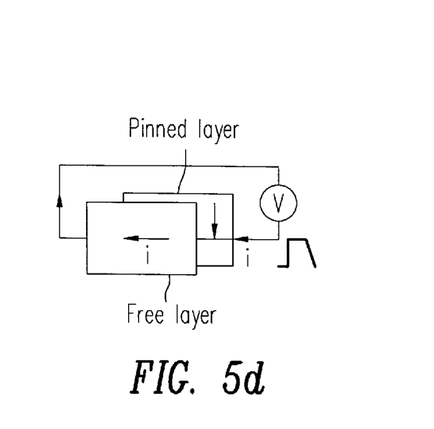

In the fourth technique (d), by applying a pulse of a predetermined voltage (for instance, about one volt) to the GMR element for a predetermined short time (for instance, 100 ns), the magnetized direction of the pinned layer within the GMR element is adjusted to recover its function. In this technique, no external magnetic field is established, but the self-generation of a magnetic field by the pulse is utilized. Although it is a simple method, the heating to a temperature equal to or higher than the blocking temperature and the generation of the magnetic field for the pinning need to be combined as the pulse action, and thus the appropriate control is difficult. Accordingly, it has a defect that the resettable window is forced to be narrow as compared with the second technique. However, it has some degree of freedom as long as it satisfies the condition that the GMR element is heated to the blocking temperature or higher by properly selecting $V_R$ and $T_R$ with respect to the shape of the pulse, as written in the enlarged pulse in the second technique (b), and the condition that the magnetic field produced by a current i is oriented to the pinning direction of the pinned layer and sufficiently strong when the element is cooled below the blocking temperature during the decay of the pulse. For instance, it may stepwise decay, or may decay while exponentially decreasing. The above technique is called a "reset pulse method."

In any technique employed, it is important to efficiently execute the reset so that a sufficient effect is obtained without giving damage.

SUMMARY OF THE INVENTION

It is the main object of the present invention to execute the reset efficiently and with a sufficient effect without causing damage to the GMR head.

It is another object of the present invention to increase the yield of the GMR head by again executing the initialization of the GMR head also in the opposite direction.

It is a further object of the present invention to provide a tool for efficient initialization and reset, which can be commonly and cooperatively used in each level.

In accordance with the present invention, as one invention, a method for executing the initialization of GMR heads is provided, the method comprising a step of disposing at least a pair of GMR heads so that longitudinally magnetized directions of the free layers in the respective GMR heads are in parallel, a step of applying an external magnetic field to the at least one pair of GMR heads in parallel with the magnetized directions of the free layers to execute the initialization, and a step of applying an external magnetic field to the at least one pair of GMR heads in the direction opposite to the above external magnetic field to execute a reinitialization.

Further, as another invention, a method for executing the reset of a GMR head is provided, the method comprising a step of applying an external magnetic field to reverse the magnetized direction in the pinned layer of the GMR head, and a step of determining if the magnetized direction of the pinned layer has been reversed.

Furthermore, as another invention, a method for executing the reset of a GMR head, the method comprising a step of applying an external magnetic field along the direction in which the pinned layer is desired to be magnetized, and a step of applying a reset pulse to the GMR head with the external magnetic field being applied.

Finally, as an apparatus which is usefully executed commonly and cooperatively to those method inventions, an apparatus for executing the initialization, reset, and read back response of a GMR head is provided, the apparatus comprising a first magnet having a pair of magnetic poles spaced apart from each other in a first direction to define a first space, a second magnet having a pair of magnetic poles spaced apart from each other in a second direction perpendicular to the first direction to define a second space, and at least a pair of coils positioned in the common space of the first and second spaces.

DETAILED DESCRIPTION OF THE INVENTION

The initialization of hard biasing for keeping a horizontal bias to be applied to the free layer can be performed at any level of the wafer, row, HGA, and HSA levels. In the present invention, however, it was found that the yield could be increased if the re-initialization of the free layer was performed at the HAS level.

Figure 6A:
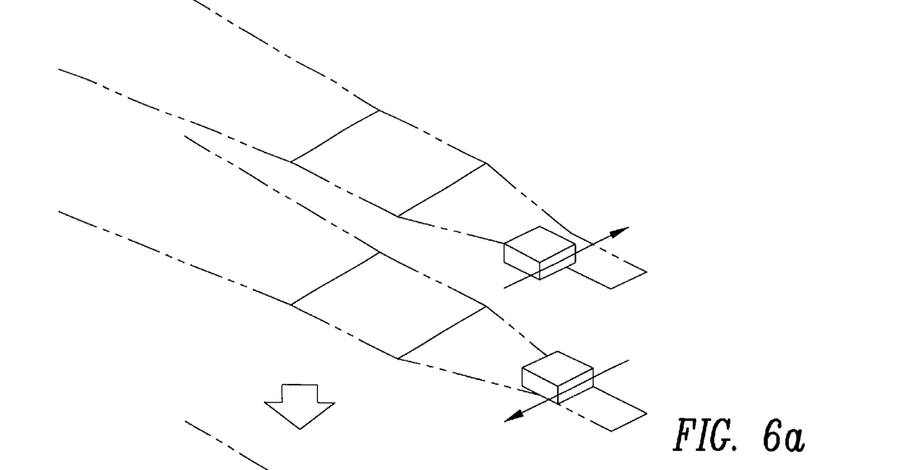
FIG. 6 is a diagrammatical view for explaining the initialization in the GMR head at the HSA level according to the present invention.
Figure 6B:
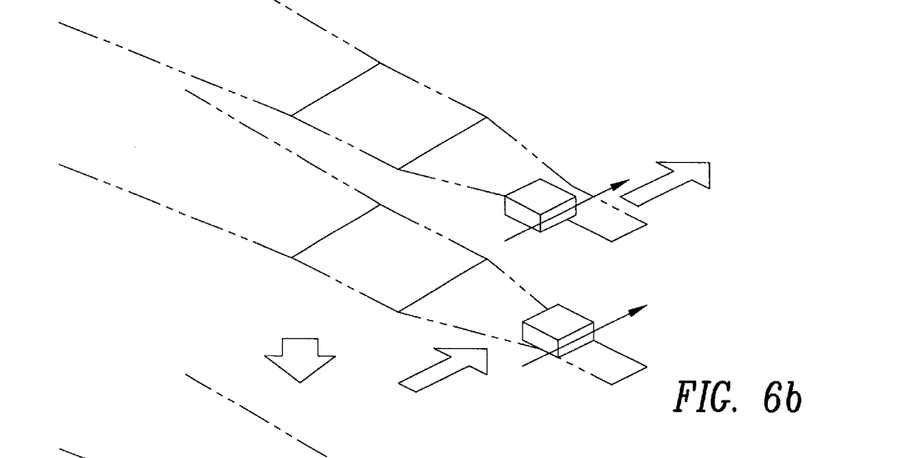
Figure 6C:
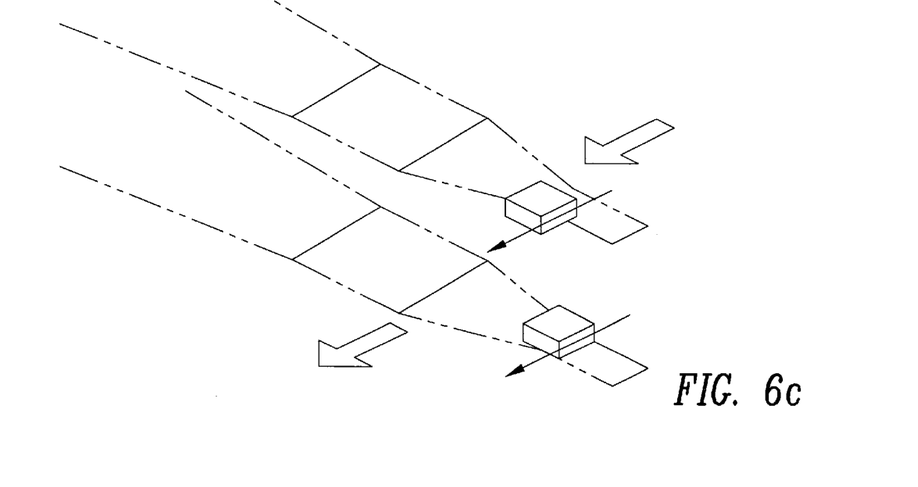

As shown in FIG. 6, GMR heads magnetized in one direction at the levels before the HSA level including the HGA level are stacked so as to face each other at the HSA level for enabling both surfaces of a magnetic recording disk to be accessed, and thus the magnetized directions are made opposited to each other as shown in (a). In this case, the initialization must be done again. Then, it is desirable that a desired initialization effect is obtained when the initialization is performed as shown in (b). As a method for testing the initialization effect, the error rate is checked at the file level, for example. The thick arrows in (b) and (c) represent the directions in which an external magnetic field is applied. If the initialization can be executed in the longitudinal direction of a GMR head, an external magnetic field can also be applied in another direction in three-dimensions, and those skilled in the art can easily infer this. Accordingly, the meaning of "parallel" should be interpreted to contain a wide meaning in addition to a magnetized direction and the direction opposite to the magnetized direction.

Of course, it is possible that two types of GMR heads, a downward GMR head and a upward GMR head, are prepared at a level such as the wafer level, and the magnetized directions are previously aligned as shown in (b) of FIG. 6. However, since all GMR heads do not always maintain uniform characteristics at the HSA level, the initialization is carried out at any rate.

It was found that, if the desired initialization effect could not be obtained in at least part of the GMR heads, the desired initialization effect may be obtained by reversing the magnetized direction as shown in (c). This is based on a new fact that, if the magnetized direction is reversed, a difference appears in the output amplitude as compared with the case in which the magnetized direction remains positive.

It is especially noted that such reversion is possible because GMR elements are used. If the reversion is attempted in the conventional MR element, the characteristics other than the output amplitude will change. For instance, the asymmetrical offset which usually appears between the magnetic center and the physical center of the AMR element would appear on the opposite side by the reversion, and thus the design itself needs to go back to the drawing board. In this respect, it has been experimentally found out that, with the GMR element, no change appears in the characteristics other than the output amplitude, and it may be reused by the reversion.

The reason for the improvement in output amplitude is not completely clear. However, it is presumably because the material itself memorizes different magnetized directions given to the GMR head at the individual process levels as a kind of history. As long as it is considered that such history is memorized, it is important to uniformly treat magnetized directions through all the process levels.

Figure 7:
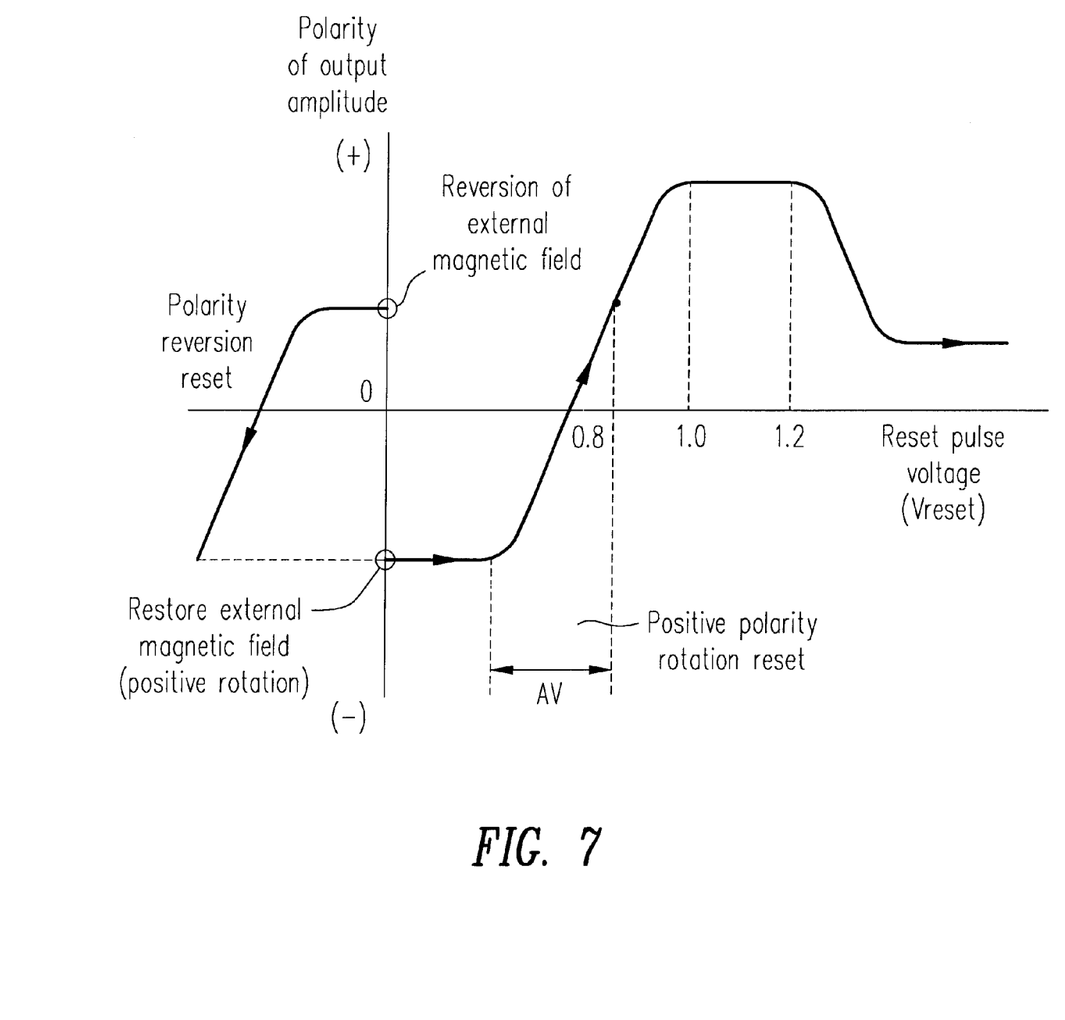
FIG. 7 is a graph exemplifying the general relationship between the reset pulse voltage and the output amplitude of the GMR head when the reset of the present invention is used.

In FIG. 7, the reset method employed in the present invention is shown. If compared with FIG. 4, it is easy to grasp the difference between them. As shown in FIG. 4, in the conventional method, the reset is performed while the polarity of the output amplitude still remains to be (+), that is, after a magnetic field is applied with respect to the pinned layer. In the present invention, however, it was found out that it is preferred to perform the reset after applying a magnetic field in the opposite direction (after reversing the external magnetic field). It is advantageous to apply a magnetic field in the opposite direction, because even if the reset voltage $V_{reset}$ is still low, the amplitude increases sharply, (i.e. has a steep slope) as the reset voltage increases. That is, as seen from FIG. 7, since the slope rises from a voltage which is low by $\Delta V$, the slope till the appropriate reset voltage can be made longer, the degree of recovery of the output amplitude can be measured more sensitively (the change in the output amplitude for the change in $V_{reset}$ becomes large). Further, it is also advantageous that, if the polarity reversion is determined to be impossible, it can be promptly judged that an irrecoverable damage has already occurred.

As the reset related to the present invention, the reset after the reversion of the external magnetic field and before the recovery of the external magnetic field is called a polarity reversion reset, and the reset after the positive rotation of the external magnetic field is called a positive polarity rotation reset.

Figure 8:
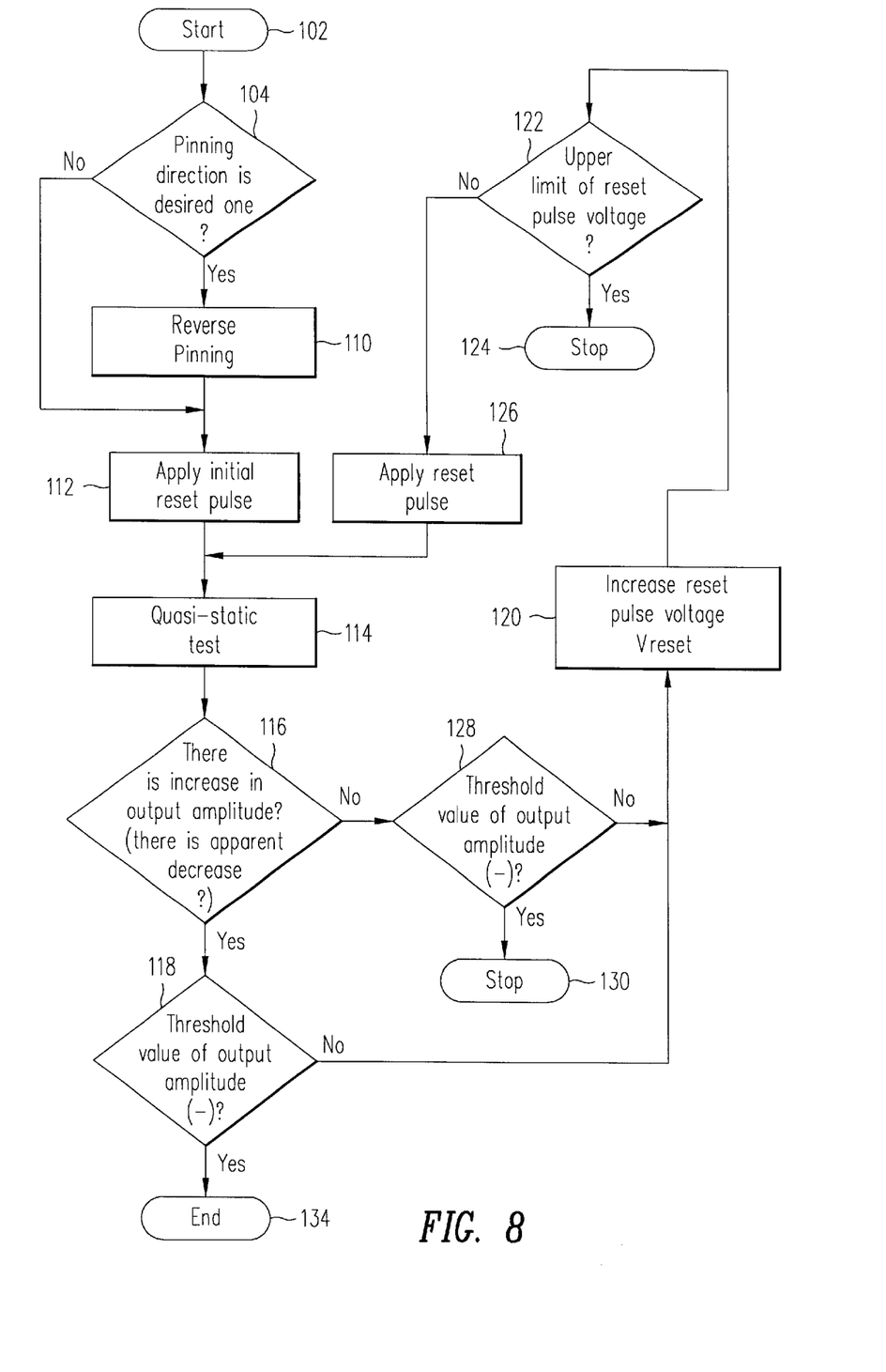
FIG. 8 is a flowchart showing the sequence of the polarity reversion reset which is the present invention.

FIG. 8 is a flowchart showing the sequence of the polarity reversion reset. It would be easily grasped as a phenomenon if FIG. 7 is referred to. First, the flow starts at 102, and in 104, it is determined whether or not the pinned direction of the GMR element is the desired one. If it is not the desired direction, the operation of reversing the pinned direction in 110 is skipped. It is because there is a possibility of later recovery, though it is not the desired direction. If the pinned direction is the desired direction in 104 the pinning in the opposite direction is executed in 110. For the pinning in the opposite direction, it is only needed to reverse the external magnetic field.

Then, in 112, an initial reset pulse is applied. It is gradually increased from a small voltage near zero. Although the gradual increase may be continuously performed, the increase will be discretely and stepwise for convenience. The reason for such gradual increase is that, if a large voltage is accidentally applied from the beginning, the GMR head can be damaged. A quasi-static test is performed in 114, and it is tested in 116 as to whether or not there is an increase in the output amplitude. The degree of the increase in the output amplitude may be compared with a predetermined threshold value based with the initial stage being as a criterion, or it may be compared with a predetermined threshold with the stage preceding the current stage being as a criterion.

It is to be noted that, as seen from FIG. 7, since the external magnetic field has been reversed, the increase in the output amplitude appears as an apparent decrease in the output amplitude (increase for the minus polarity). Accordingly, if an increase appears in the output amplitude, it is determined in 118 whether or not the value of the output amplitude has reached the threshold value of the output amplitude which is provided in the (−) polarity. The threshold value of the output amplitude, which is provided in the (−) polarity, only needs to be a value which is large enough to enable the determination of whether or not the reversion was possible.

If, in 118, the threshold value has not been reached yet, the reset pulse voltage is increased in 120. Since the reset pulse larger than a certain voltage may damage the GMR head, it is determined in 122 whether or not the reset pulse has reached the upper limit value. The upper limit value of the reset pulse is preferably set within the resettable window depicted in FIG. 3. If the reset pulse voltage has reached the upper limit value, the increase is ceased in 124. Since the increase is ceased, it is proper that the GMR head is treated as a irrecoverable defective GMR head. If the upper limit value has not been reached yet, a reset pulse is applied in 126 and the flow returns to the loop for again executing the quasi-static test. If there is no increase in the output amplitude in 116, it is determined in 128 whether or not the value of the output amplitude has reached the threshold value of the output amplitude which is given in the (−) polarity.

As can be understood from the characteristics shown in FIG. 7, little increase (apparent decrease) is seen in the output amplitude while the reset pulse is low. The reset pulse voltage is increased while the threshold value is not reached, and if the threshold value is reached before an increase appears in the output amplitude, the GMR head is determined to be the one for which the polarity reversion cannot be performed, and the process is stopped in 130. If, in 118, the value of the output amplitude has reached the threshold value of the output amplitude which is given in the (−) polarity, the polarity reversion reset ends in 134.

Figure 9:
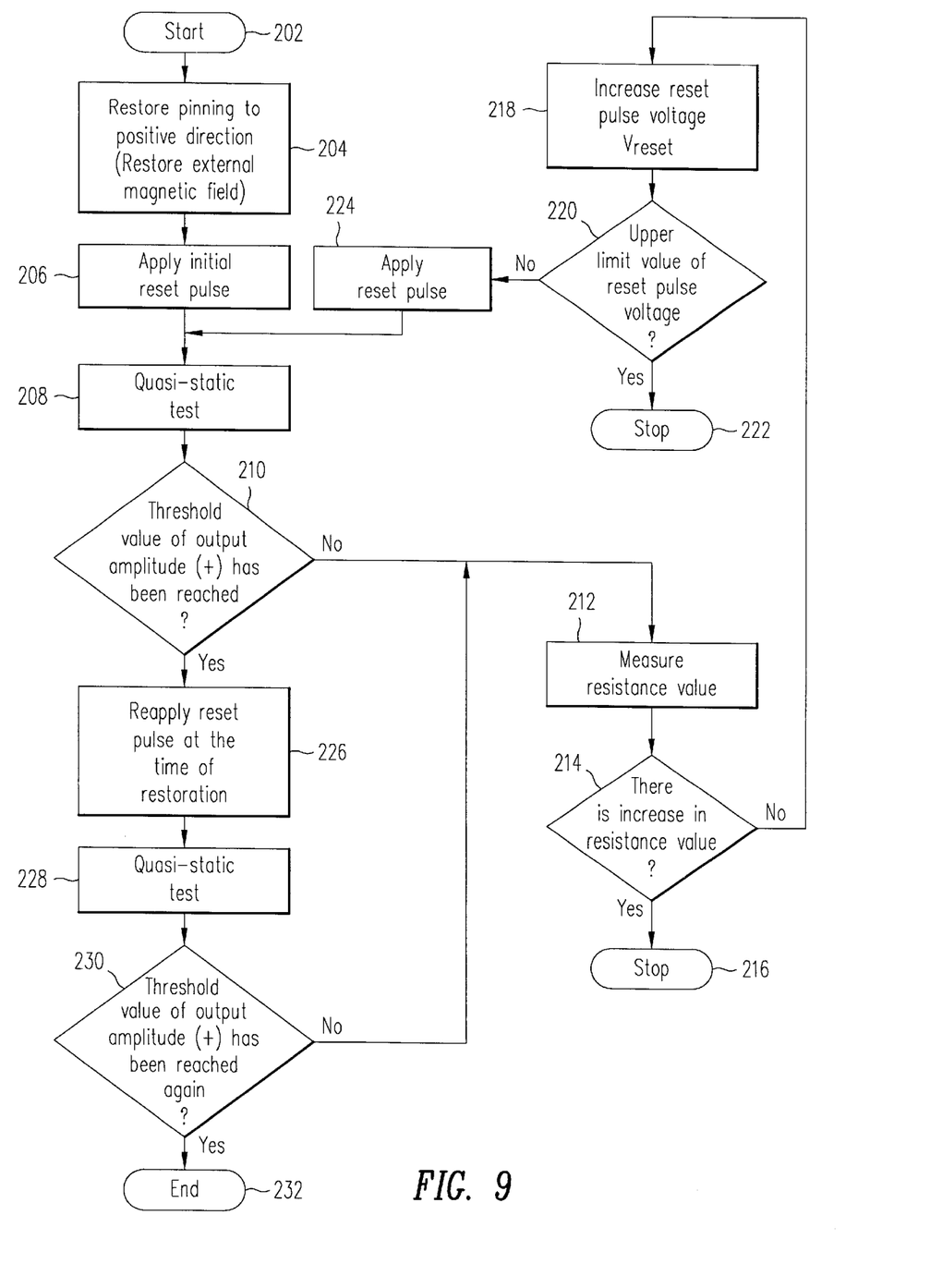
FIG. 9 is a flowchart showing the sequence of the positive polarity rotation reset which is the present invention.

FIG. 9 is a flowchart showing the sequence of the positive polarity rotation reset. This also would be easily grasped as a phenomenon if FIG. 7 is referred to. The dotted line shows that the output amplitude, which could have reached the threshold value in the polarity reversion reset, becomes the initial output amplitude when the external magnetic field is restored. If necessary, the value of the reset pulse voltage applied to obtain the output amplitude, which could have reached the threshold value in the polarity reversion reset, can be used in 220 as the upper limit value of the reset pulse voltage in the positive polarity rotation reset. It is used in the (+) polarity as an effective value obtained as a safe level in the (−) polarity. This is based on the assumption that the characteristics obtained by the reversion of the external magnetic field may also be obtained even if the external magnetic field positively rotates. Of course, there may be other various methods for setting the upper limit value.

The positive polarity rotation reset starts at 202, and in 204, the pinned direction of the GMR element is restored by positively rotating the external magnetic field. Then, in 206, an initial reset pulse is applied. It is also gradually increased from a small voltage. A quasi-static test is carried out in 208, and the magnitude of the output amplitude is determined in 210. The output amplitude was obtained as the (−) polarity in 132, but, in this case, it is noted that it is given as the (+) polarity because the external magnetic field has been restored. In 210, it is determined whether or not the output amplitude has reached the threshold value. If the threshold value has not been reached yet in 210, the resistance value is measured in 212. It is done to evaluate the resistance value as degradation in a wide sense, as already described. If, in 214, there is an increase in the resistance value, the process is stopped in 216. If there is no increase in the resistance value, a reset pulse voltage is increased in 218. Since a reset pulse larger than a certain voltage may damage the GMR head, it is determined in 220 whether or not the reset pulse has reached the upper limit value. If the upper limit value has been reached, the process is stopped in 222. If the upper limit value has not been reached yet, the reset pulse is applied in 224 and the process returns to the loop for again executing the quasi-static test.

If the output amplitude has reached the threshold value in 210, then in 226, the reset pulse voltage at the time when the threshold value has been reached is reapplied as the reset value voltage whose output amplitude has been restored, and a check is again performed as to whether the output amplitude has reached the threshold value. It is preferable that the operation is further repeated for the check, but, since the number of times the reset voltage is applied is the possibility factor of damage, or the cause of degradation, as described above, the number of repetition is preferably limited to one. Of course, if the check is more important, further repetition is allowed. A quasi-static test is performed in 228, and in 230, it is again determined whether the output amplitude has reached the threshold value. If, as the result of the recheck on the output amplitude in 230, the threshold value has not been reached again, the reset is deemed insufficient, and the process returns to the loop to determine whether or not there is an increase in the resistance value, and then the reset pulse voltage is increased. If the threshold value has been reached in the recheck on the output amplitude in 230, the reset is deemed sufficient, and the positive polarity rotation reset ends at 232.

Figure 10:
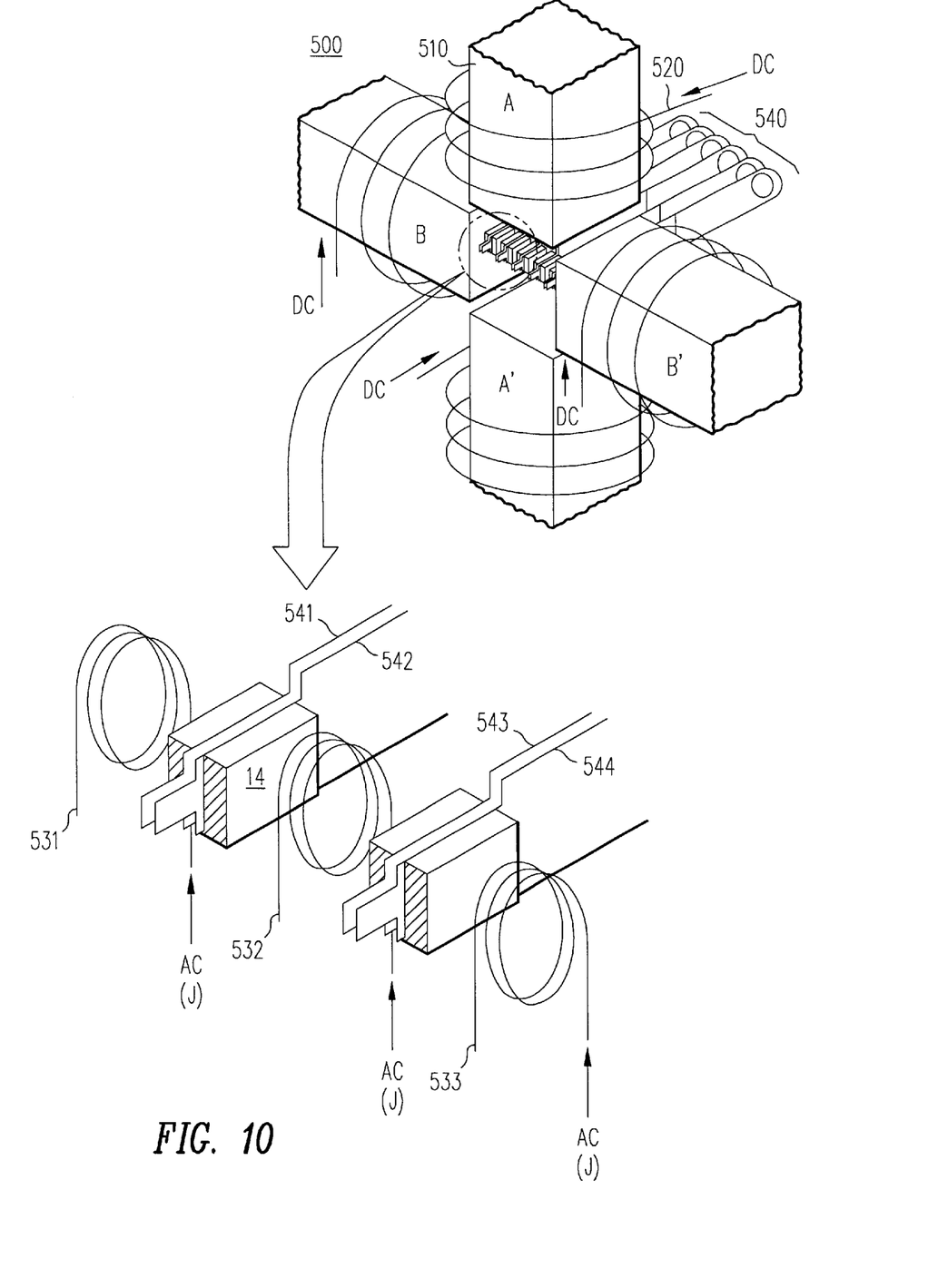
FIG. 10 is a perspective view showing a tool which can be used for executing each of the initialization, reset, and read back response of the GMR head, partly enlarged.

FIG. 10 shows a tool 500 which can be used for each of the initialization, reset, and read back response of a GMR head. An electromagnet AA' (a coil 520 is wound around an iron core 510) and an electromagnet BB' (the coil 520 is wound around the iron core 510), which are arranged in upward and downward directions, respectively, can generate a magnetic field independently of each other. The respective electromagnets are separated between A and A' and between B and B', and have a pair of magnetic poles. Since they are separated, the pair of magnetic poles of each defines a space. A magnetic field can also be generated by using permanent magnets instead of electromagnets. In FIG. 10, a stacked suspension assembly 540 at the HSA level is arranged as being inserted in the common space between the electromagnets where a magnetic field for initialization is generated in the direction of AA' in the arrangement in this figure, and a magnetic field for pinning is generated in the direction of BB'. That is, these directions are orthogonal. A DC magnetic field (a magnetic field where the direction and intensity are fixed) is required for generating those magnetic fields, and in this case, a DC current is fed through the coil 520.

In the common space between the pair of electromagnets AA' and the pair of electromagnets BB', Helmholz coils are provided. The Helmholz coils in this specification contains a wide meaning as long as they are coils used for obtaining a uniform magnetic field. If a current J is fed through two coils in the same direction, the magnetic field generated in the vicinity of the center becomes uniform. Accordingly, it is convenient for executing a "quasi-static test" for measuring the read back response of the GMR head in a low-frequency magnetic field. It is because the GMR head can be placed in a uniform magnetic field. The GMR head is mounted on the diagonally shaded surface (also refer to FIG. 1(c)).

Further, if the stacked suspension assembly 540 at the HSA level is arranged as being inserted, for instance, suspension assemblies 541 and 542 can be sandwiched by coils 531 and 532 to form Helmholz coils. In addition, since suspension assemblies 543 and 544 can conveniently sandwiched by the coil 532 and a coil 533, the coil 532 can be substituted as the adjacent Helmholz coil. That is, if the coil 531, coil 532, and coil 533 are used as the adjacent pairs and sequentially used as Helmholz coils, it is very efficient. In the actual read back response, the current J is fed in the same direction and only through the adjacent coils sandwiching the GMR head which is selected as the subject to the read back response. That is, it is only needed to sequentially apply an AC magnetic field in the same direction of the same winding direction of the pair of 531+532 and the pair of 532+533. If the current J is fed through the selected pair of 531+532, the current J is not fed through 533. However, coils can be freely selected and combined for generating a uniform magnetic field, and those other than the adjacent coils can be simultaneously used.

Specifically, if electromagnets are used as the magnets AA' and BB', it is unnecessary to be concern about the effect of the leakage magnetic field that causes a problem in the operation of drawing out the GMR head when a magnetic field is set by permanent magnets. The reason for this is that it is only needed to stop the supply of the current being applied to the electromagnets to easily eliminate the magnetic field. Owing to the use of electromagnets, a delicate change may also be provided. However, even if the magnets AA' and BB' are permanent magnets, a similar effect can be accomplished by using a movable stage to move them to a place where the magnetic field has no effect.

Further, there is a merit that the tool can be commonly used for each operation of the initialization, reset, and read back response. The reason is that, since these operations are often repeated in a process executed in the present invention, it is convenient if the movement between stages are eliminated. Since the respective operations of initialization, reset, and read back response need to be linked, the operation of resetting to the original position is unnecessary. Accordingly, they can be utilized for every process level. The positional shift easily caused by a reset can be prevented. The movement itself is not preferable, because it leads to the generation of an external stimulus from the viewpoint of ESD.

We claim:

1. A method for executing the initialization of GMR heads, comprising the steps of:

disposing at least one pair of GMR heads so that the longitudinally magnetized directions of the free layers in the respective GMR heads are in parallel;

applying a first external magnetic field to said at least one pair of GMR heads in parallel with the magnetized directions of said free layers to execute the initialization; and applying a second external magnetic field to said at least one pair of GMR heads in the direction opposite to said external magnetic field to execute a reinitialization.

2. A method as set forth in claim 1 wherein, in the step of disposing said at least one pair of GMR heads, they are disposed so that the magnetized directions of said free layers are opposite to each other.

3. A method as set forth in claim 1 wherein, in the step of disposing said at least one pair of GMR heads, they are disposed so that the magnetized directions of said free layers are the same.

4. A method for setting a magnetization of a free layer in a Giant Magnetoresistive (GMR) head, comprising the steps of:

applying a first magnetic field to said free layer of said GMR head, said first magnetic field being in a first direction;

applying a second magnetic field to said free layer of said GMR head, said second magnetic field being in a second direction substantially opposite and parallel to said first direction of said first magnetic field.

5. A method as set forth in claim 4 further comprising the step of applying a voltage to said GMR head during said application for said first and second magnetic fields.

* * * * *